US011877417B2

(12) United States Patent
Beissert et al.

(10) Patent No.: US 11,877,417 B2
(45) Date of Patent: Jan. 16, 2024

(54) HOUSING MODULE AND FIELD DEVICE

(71) Applicant: Endress+Hauser Flowtec AG, Reinach (CH)

(72) Inventors: Markus Beissert, Auggen (DE); Harald Müller, Fulda (DE); Martin Binzer, Zwingen (CH)

(73) Assignee: Endress+Hauser Flowtec AG, Reinach (CH)

( * ) Notice: Subject to any disclaimer, the term of this patent is extended or adjusted under 35 U.S.C. 154(b) by 242 days.

(21) Appl. No.: 17/626,233

(22) PCT Filed: Jun. 18, 2020

(86) PCT No.: PCT/EP2020/066961
§ 371 (c)(1),
(2) Date: Jan. 11, 2022

(87) PCT Pub. No.: WO2021/004755
PCT Pub. Date: Jan. 14, 2021

(65) Prior Publication Data
US 2022/0304181 A1    Sep. 22, 2022

(30) Foreign Application Priority Data
Jul. 11, 2019   (DE) .......................... 102019118805.9

(51) Int. Cl.
*G01D 11/24* (2006.01)
*H05K 7/14* (2006.01)

(52) U.S. Cl.
CPC ......... *H05K 7/1462* (2013.01); *G01D 11/245* (2013.01)

(58) Field of Classification Search
CPC .......................... H05K 7/1462; G01D 11/245
See application file for complete search history.

(56) References Cited

U.S. PATENT DOCUMENTS

2009/0258532 A1   10/2009  Beier et al.

FOREIGN PATENT DOCUMENTS

| CN | 101449431 A | 6/2009 |
| CN | 105041778 A | 11/2015 |
| CN | 107305001 A | 10/2017 |
| DE | 4205867 A1 | 9/1992 |

(Continued)

*Primary Examiner* — Jamel E Williams
(74) *Attorney, Agent, or Firm* — Christopher R. Powers; Endress+Hauser (USA) Holding, Inc.

(57) ABSTRACT

A housing module of a field device includes: a housing including a first housing chamber and a second housing chamber separated by a partition wall; measurement/control electronics disposed in the first housing chamber; interface electronics for connecting lines for supplying energy to the field device arranged in the second housing chamber, wherein the housing includes a first wall region to receive the partition wall, the first wall region separated from the partition wall by a gap having a path length, wherein the ratio of a gap width to the path length is less than 0.02; and a securing device for limiting a range of movement of the partition wall toward the second housing chamber, wherein the housing includes a second wall region with a groove extending parallel to a cross-sectional plane of the partition wall, the securing device including an engagement device to engage in the groove.

12 Claims, 4 Drawing Sheets

(56) References Cited

FOREIGN PATENT DOCUMENTS

| | | | |
|---|---|---|---|
| DE | 10126654 A1 | 12/2002 | |
| DE | 102014106540 A1 | 11/2015 | |
| WO | 2007090421 A1 | 8/2007 | |
| WO | 2011160949 A1 | 12/2011 | |
| WO | WO-2011160949 A1 * | 12/2011 | ........... G01D 11/245 |

* cited by examiner

HOUSING MODULE AND FIELD DEVICE

CROSS-REFERENCE TO RELATED APPLICATIONS

The present application is related to and claims the priority benefit of German Patent Application No. 102019118805.9, filed on Jul. 11, 2019 and International Patent Application No. PCT/EP2020/066961, filed Jun. 18, 2020, the entire contents of which are incorporated herein by reference.

TECHNICAL FIELD

The invention relates to a housing module of a field device in measurement and automation technology and to such a field device, wherein the housing module has at least two housing chambers, wherein the housing chambers are separated by a partition wall, wherein the housing module meets the ignition protection type Ex-d.

BACKGROUND

WO2011160949A1 discloses such a housing module having such a partition wall, wherein a measurement and control electronics unit is arranged in a first housing chamber, and wherein an interface electronics unit is arranged in a second housing chamber. An electrical connection is guided through an opening in the partition wall, wherein the opening is filled with a casting compound in order to satisfy requirements with regard to ignition protection type Ex-d. The partition wall itself is arranged in a detachable manner in the housing module as a screw-in closure and also meets the requirements of ignition protection type Ex-d.

Screwing in a partition wall makes the production and assembly of the housing module more difficult and thus increases the overall costs of the housing module since a helical groove has to be introduced as a thread into a housing wall, and the partition wall has to be screwed into the housing in a complex process.

SUMMARY

The object of the invention is therefore to propose a housing module and a field device with such a housing module, in which manufacturing and maintenance are simplified, while the requirements of ignition protection type Ex-d are met.

The object is achieved by a housing module and by a field device according to the present disclosure.

A housing module according to the invention comprises a housing having a housing wall and a first housing chamber and also a second housing chamber, which housing chambers are separated by a partition wall, wherein a measurement/control electronics unit of the field device is arranged in the first housing chamber, and an interface electronics unit for connecting lines for supplying energy to the field device and/or for exchanging data is arranged in the second housing chamber, wherein the housing wall has, on an interior side, a first wall region designed to receive the partition wall, the first wall region being separated from a lateral surface of the partition wall by a gap surrounding the partition wall, the gap having a path length in a plane containing a longitudinal section of the partition wall, wherein a ratio of the gap width to the path length is less than 0.05 and, especially, less than 0.025 and preferably less than 0.02 and meets requirements of the Ex-d standard according to IEC60079-1 of 2014-06; EN60079-1 of 2014-06, wherein a securing device is provided for limiting a range of movement of the partition wall toward the second housing chamber, characterized in that the housing wall has, on the interior side, a second wall region, in which second wall region the housing wall has, at least in parts, at least one groove, the groove running parallel to a cross-sectional plane of the partition wall, wherein the securing device has an engagement device, which is designed to engage in the groove, wherein the engagement device has at least two engagement elements, which engagement elements are guided from an initial position into a target position into an associated groove when the securing device is installed in the second housing chamber, wherein the engagement elements can be fastened in the target position by means of a fastening device.

In one development, the securing device has a holding device having a main body, which is designed to hold the engagement elements movably in the initial position, and wherein the holding device is designed to guide the engagement elements into the target position during installation.

In one development, each engagement element has at least two notches, each having a first notch end facing the associated groove and a second notch end facing away from the associated groove, wherein the holding device has at least one first guide body for each notch, wherein the first guide bodies, in the region of the associated notch, surround the associated engagement element from a side of the engagement element which faces the initial position, wherein each first guide body has a guide head, which guide head engages in the associated notch and is designed to cause the engagement element to be guided via the second notch end.

In one development, the guide head has a first oblique surface on a the associated second notch end, which extends obliquely with respect to the cross-sectional plane of the partition wall, wherein the first oblique surface is designed, when the engagement element is moved into its target position, to impart to the movement a component in the direction of the main body.

In one development, the holding device has at least one second guide body for each engagement element, which second guide body protrudes from the main body and in each case has at least one second oblique surface, which second oblique surface runs obliquely with respect to the cross-sectional plane of the partition wall, wherein the second oblique surface is designed, when an associated engagement element is moved into its target position, to impart to the movement a component parallel to the cross-sectional surface of the partition wall in the direction of the housing wall.

In one development, the partition wall has at least a first hole with an internal thread for each engagement element, wherein each of the engagement elements has at least one through-hole, wherein the through-holes are each coaxial to a first hole when the engagement elements are positioned in their target positions, wherein the engagement elements are fastened by means of screws in the target position, which screws in each case engage in the thread of a first hole.

In one development, the holding device for each screw has a receiving device for receiving a screw head of the respective screw, wherein, when an engagement element is fastened in its target position by means of a screw, the screw head of the respective screw is countersunk in the receiving device.

In one development, the holding device is made of a plastic material, such as a polycarbonate, by means of injection molding.

In one development, the engagement elements are each made of a metal or an alloy, such as stainless steel 1.4301.

In one development, the partition wall has at least one cut-out, which is designed to at least partially receive the first guide bodies.

In one development, the partition wall has a feedthrough designed for an electrical connection between the measurement/control electronics and the interface electronics.

A field device of measurement and automation technology according to the invention comprises:

a housing module according to any one of the preceding claims;

a measuring transducer for detecting at least one measured variable, and for providing a measurement signal representing the measured variable, wherein the measurement/control electronics unit is designed to determine and provide measured values of the measured variable by means of the measurement signal.

BRIEF DESCRIPTION OF THE DRAWINGS

The invention will now be described with reference to exemplary embodiments.

DETAILED DESCRIPTION

Figure 1:
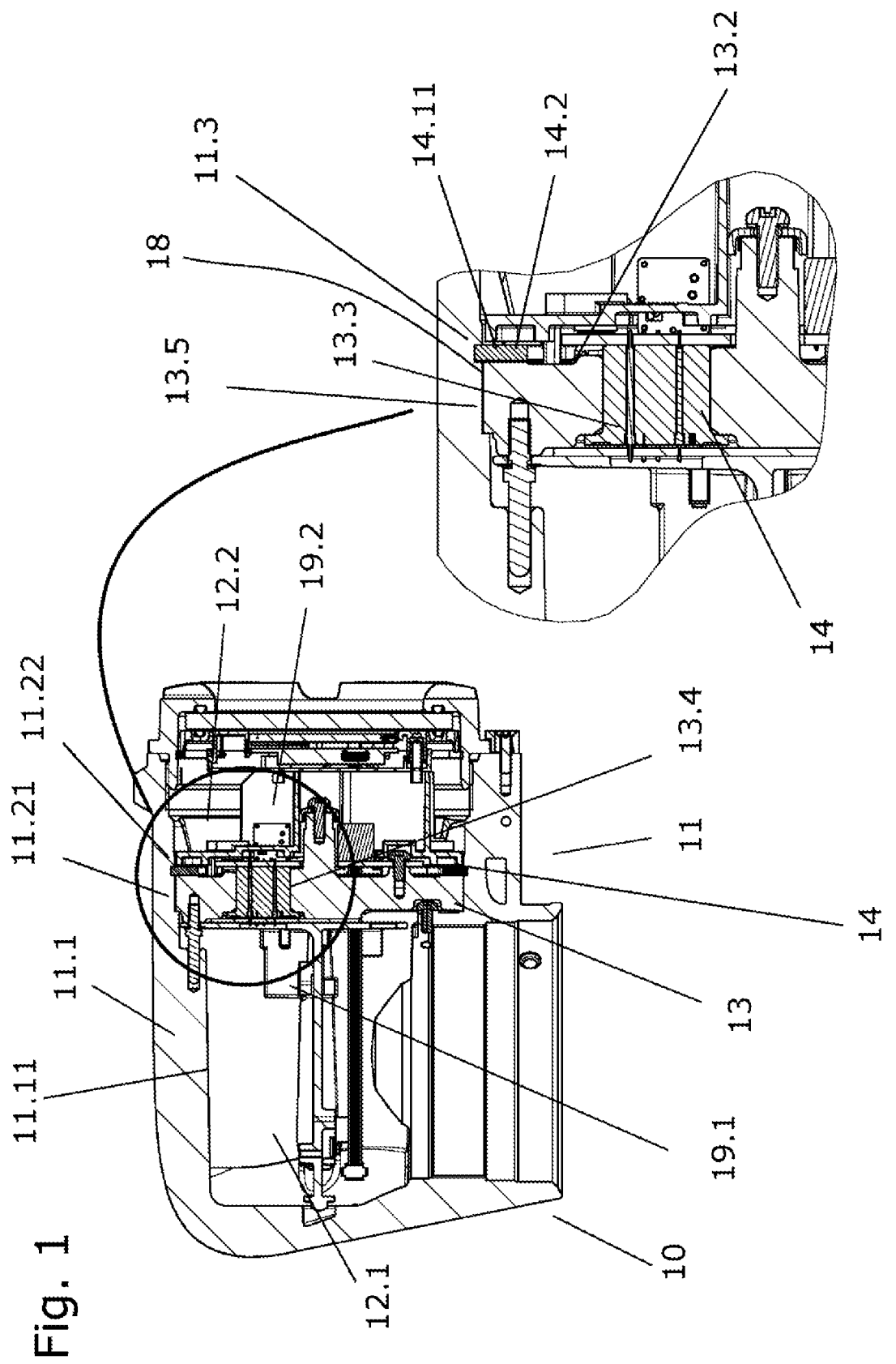
FIG. 1 illustrates the structure of a housing module according to the present disclosure.

FIG. 1 shows a cross-section through a housing module 10 of a field device 1 in measurement and automation technology, comprising a housing 11 with a housing wall 11.1, which housing comprises a first housing chamber 12.1 and a second housing chamber 12.2, which are separated by a partition wall 13. The partition wall has a through-opening 13.4.

A measurement/control electronics unit 19.2 is arranged in the first housing chamber 12.1, and an interface electronics unit 19.2 is arranged in the second housing chamber. The measurement/control electronics unit is designed to receive measurement signals of a measuring transducer and to provide measured values for a measured variable represented by the measurement signals. The interface electronics unit is designed, for example, to allow the measured values to be read out or to allow a supply line to be connected. The measurement/control electronics and the interface electronics are connected by means of an electrical feedthrough 13.3, which electrical feedthrough is arranged in the through-opening. The separation of the first housing chamber from the second housing chamber satisfies the Ex-d standard according to IEC60079-1 of 2014-06; EN60079-1 of 2014-06, wherein the partition wall and the electrical feedthrough inserted into the through-opening form a flame arrestor.

On an interior side 11.11, the housing wall has a first wall region 11.21 designed to receive the partition wall, wherein the first wall region is separated from a lateral surface 13.5 of the partition wall by a gap 18 surrounding the partition wall (see enlarged detail), wherein the gap has a path length in a plane containing a longitudinal section of the partition wall, wherein a ratio of the gap width to the path length is less than 0.05, and in particular is less than 0.025 and preferably is less than 0.02 and corresponds to the Ex-d standard according to IEC60079-1 of 2014-06; EN60079-1 of 2014-06. A securing device 14 is provided for limiting a range of movement of the partition wall toward the second housing chamber. On the interior side, the housing wall has a second wall region 11.22, in which second wall region the housing wall has, at least in parts, at least one groove 11.3, which groove runs parallel to a cross-sectional plane of the partition wall. According to the invention, the securing device has an engagement device 14.1 which is designed to engage in the groove by means of at least two engagement elements 14.2. When the securing device is installed in the second housing chamber, the engagement elements are guided from an initial position 16.1 into a target position 16.2 (see FIGS. 2 a) and 2 b)) by means of guide bodies provided for this purpose; see FIGS. 2 a) and 2 b).

Figure 3:
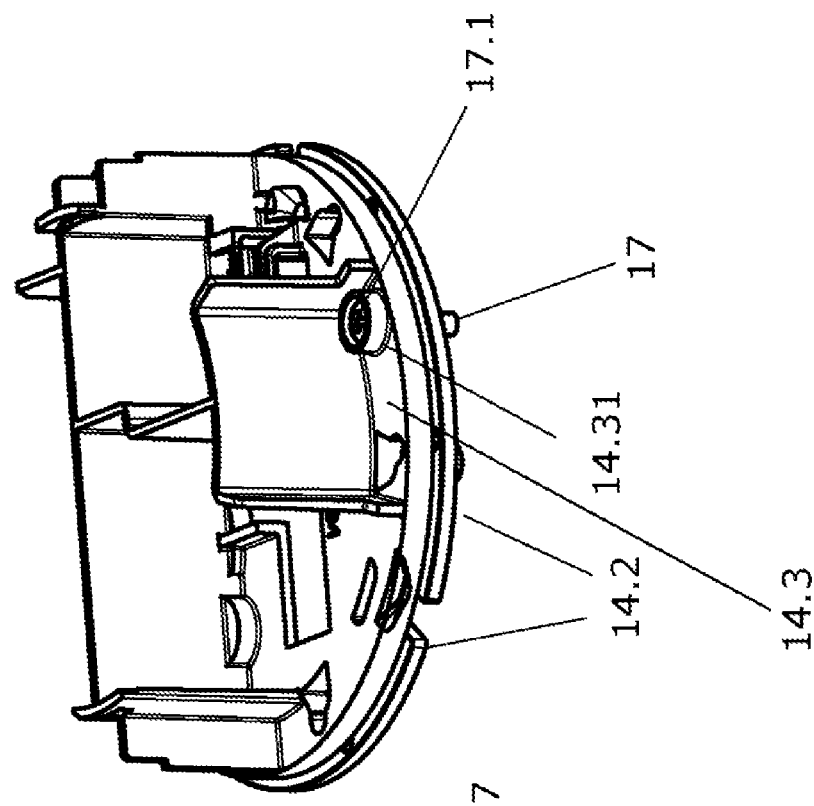
FIGS. 3a and 3b each show a top view of the securing device shown in FIGS. 1, 2a and 2b with engagement elements in the target position.
Figure 3:
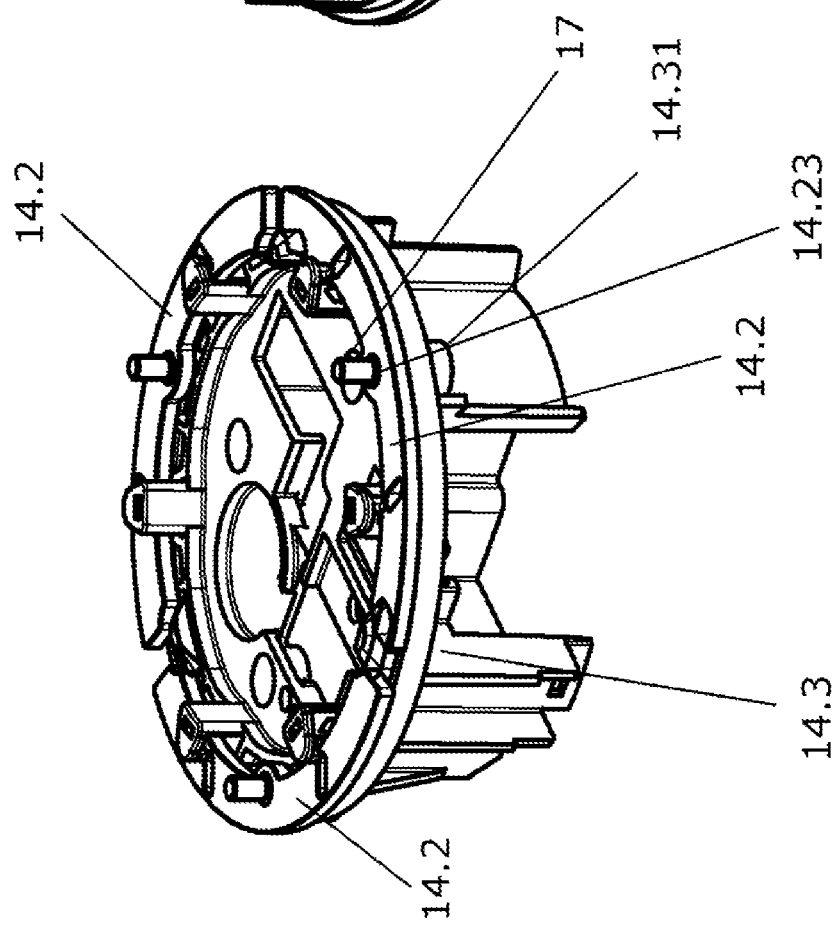

Installation here includes screwing the securing device to the partition wall, wherein screws 17, see FIGS. 3 a) and b), engage in holes provided for this purpose in the partition wall.

Figure 2:
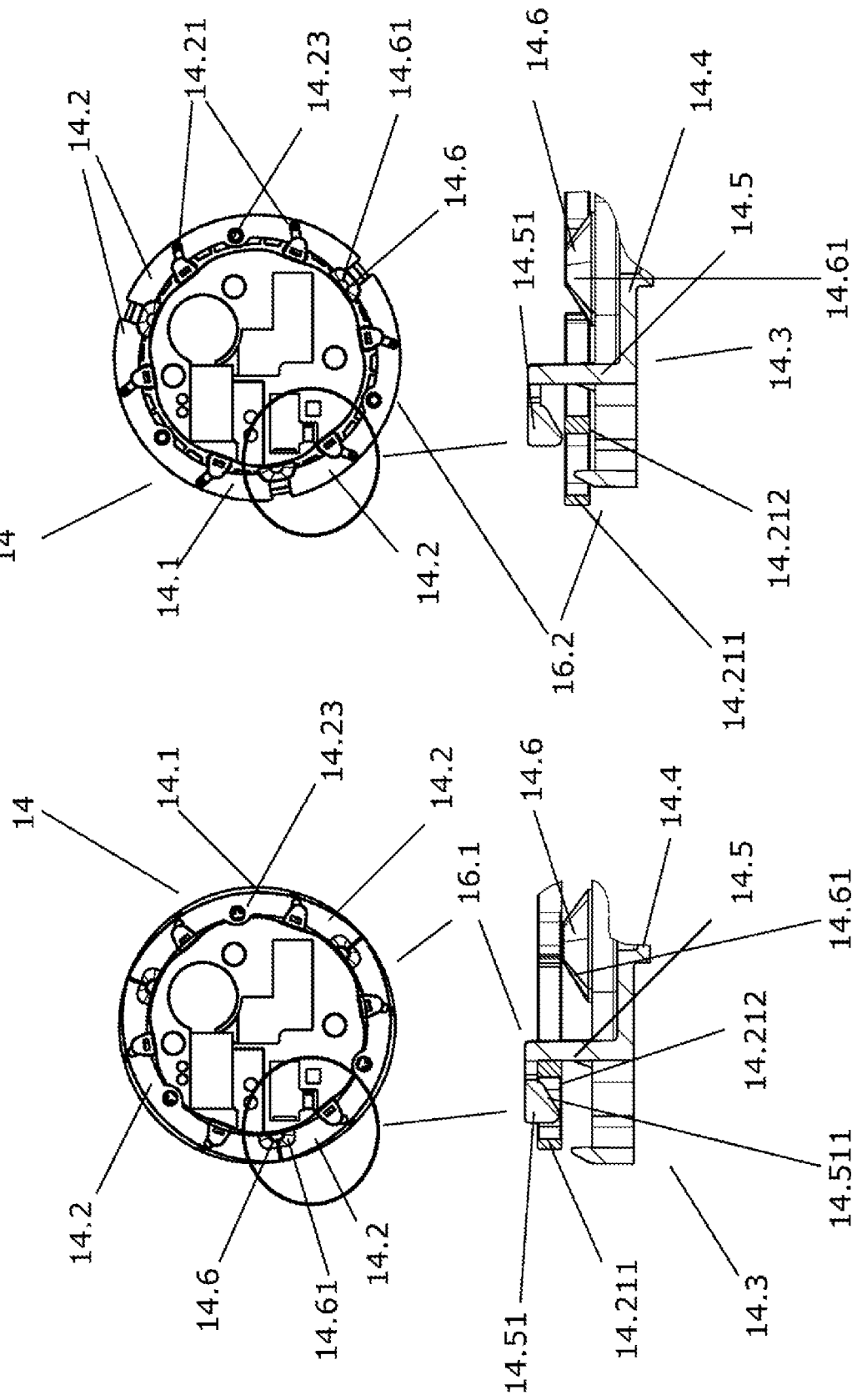
FIG. 2a shows a plan view of an exemplary securing device according to the present disclosure and a partial sectional, detailed view through a section of the securing device.
FIG. 2b shows a further plan view of the securing device shown in FIG. 2a and a partial sectional, detailed view through a section of the securing device.

FIGS. 2 a) and 2 b) show plan views of a side of the securing device 14 to be turned toward the first housing chamber, comprising an engagement device 14.1, which engagement device has three engagement elements 14.2, wherein the engagement elements are in the initial position in FIG. 2 a) and are in a target position in FIG. 2 b). The securing device further comprises a holding device 14.3 having a main body 14.4 designed to hold the engagement elements movably in the initial position, and wherein the holding device is designed to guide the engagement elements into the target position during installation. During installation, the engagement elements are pressed against the partition wall and guided by means of guide bodies provided for this purpose from the initial position into the end position, which guide bodies in each case restrict a freedom of movement of the associated engagement element.

Each engagement element 14.2 has two notches 14.21, each having a first notch end 14.211 facing the associated groove and a second notch end 14.212 facing away from the associated groove. The number of notches is to be interpreted in this case as an example and is not to be interpreted as limiting.

For each engagement element, the holding device has two first guide bodies 14.5 each with a guide head 14.51, which guide heads in each case have a first oblique surface 14.511, wherein the first guide bodies surround the associated engagement element from a side of the engagement element which faces the initial position in the region of the associated notch. The guide heads 14.51 in each case engage in an associated notch and cause the engagement element to be guided via the second notch end, wherein the guide head has a first oblique surface 14.511 on one of the associated second notch ends, which runs obliquely with respect to the cross-sectional plane of the partition wall, wherein the first oblique surface is designed, when the engagement element is moved into its target position, to impart to the movement a component in the direction of the main body.

For each engagement element, the holding device has two second guide bodies 14.6 arranged laterally with respect to the particular engagement element, which second guide bodies protrude from the main body and in each case have at least one second oblique surface 14.61, which second oblique surface runs obliquely with respect to the cross-sectional plane of the partition wall. The second oblique surface is designed, when an associated engagement element is moved into its target position, to impart to the movement a component parallel to the cross-sectional surface of the partition wall in the direction of the housing wall.

The combination of first guide bodies and second guide bodies thus forces the engagement elements to have a defined movement along a trajectory, which movement is caused by pressing the engagement elements against the partition wall.

FIGS. 3 *a*) and 3 *b*) each show a view of the securing device shown in FIGS. 1 and 2 *a*) and 2 *b*) with engagement elements in the target position from two opposite directions, wherein screws 17 are guided through a respective hole in the holding device and an associated through-hole. The screws can only be guided through both associated holes when the engagement elements 14.2 are in the target position, since only then are the holes of the holding devices and associated through-holes 14.23 of the engagement elements 14.2 coaxial. The holding device 14.3, as shown in FIG. 3 *b*), preferably has a receiving device for each screw, in which a screw head 17.1 of the screw can be countersunk during installation, and thus visual feedback is provided when the securing device has been installed correctly.

Figure 4:
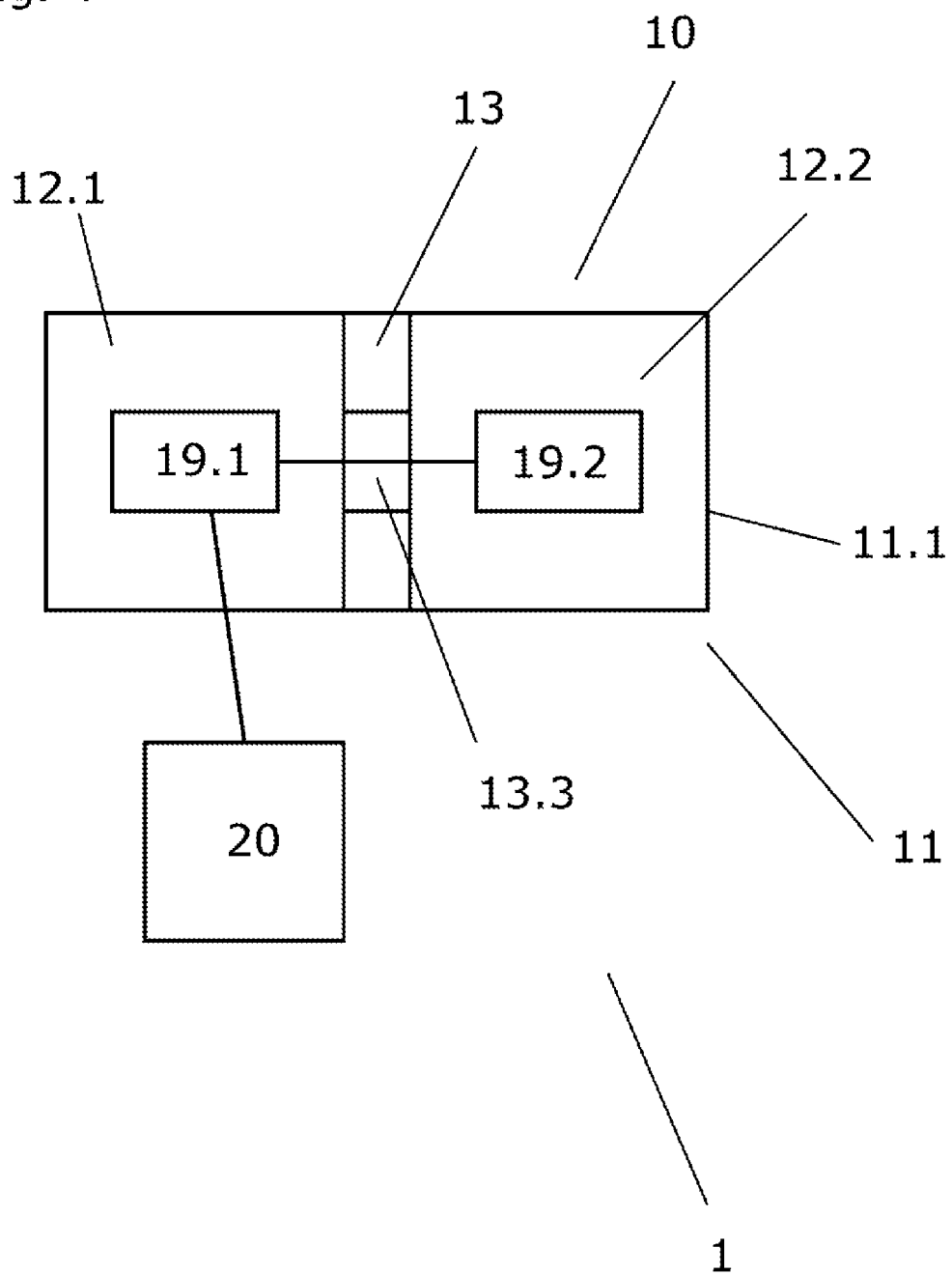
FIG. 4 shows a schematic structure of a field device with a housing module according to the present disclosure.

FIG. 4 shows a schematic exemplary structure of a field device 1 in measurement and automation technology, which has a housing module 10 according to the invention with a housing 11, which housing is formed by a housing wall 11.1. The housing module has a first housing chamber 12.1 and a second housing chamber 12.2, which are separated by a partition wall 13. The partition wall can be designed to be detachably fastened. An electronic measurement/control circuit 19.2 is arranged in the first housing chamber and is designed to operate a measuring transducer 20 of the field device, and an interface electronics unit 19.2 is arranged in the second housing chamber. A feedthrough 14 according to the invention, as described above, is designed to electrically connect the measurement/control electronics to the interface electronics.

The invention claimed is:

1. A housing module of a field device of measurement and automation technology, the housing module comprising:
 a housing including a housing wall, which defines a first housing chamber and a second housing chamber, wherein the first housing chamber and the second housing chamber are separated by a partition wall, which is releasably fastened;
 a measurement/operating electronics unit disposed in the first housing chamber;
 an interface electronics unit disposed in the second housing chamber and configured to enable connecting lines for supplying power to the field device and/or for exchanging data, wherein the housing wall includes, on an interior side, a first wall region configured to receive the partition wall, the first wall region separated from a lateral surface of the partition wall by a gap surrounding the partition wall, the gap having a gap width and a path length in a plane containing a longitudinal section of the partition wall,
 wherein a ratio of the gap width to the path length is less than 0.05 and meets requirements of an Ex-d standard according to IEC60079-1 of 2014-06 and EN60079-1 of 2014-06; and
 a securing device configured to limit a range of movement of the partition wall toward the second housing chamber,
 wherein the housing wall includes, on the interior side, a second wall region in which the housing wall includes, at least in parts, at least one groove, the at least one groove extending parallel to a cross-sectional plane of the partition wall,
 wherein the securing device includes an engagement device configured to engage in the at least one groove, wherein the engagement device includes at least two engagement elements that are configured such that, when the securing device is installed in the second housing chamber, the at least two engagement elements are guided from an initial position into a target position in an associated groove, and
 wherein the at least two engagement elements are further configured to be fixed in the target position by a fastening device.

2. The housing module of claim 1, wherein the securing device includes a holding device with a main body configured to hold the at least two engagement elements movably in the initial position, wherein the holding device is configured to guide the at least two engagement elements into the target position during installation.

3. The housing module of claim 2, wherein each of the at least two engagement elements includes at least two notches, each having a first notch end facing the associated groove and a second notch end opposite the associated groove,
 wherein the holding device includes at least one first guide body for each of the at least two notches, wherein each first guide body, in an area of its corresponding notch, surrounds the corresponding engagement element from a side of the engagement element which faces the initial position,
 wherein each first guide body includes a guide head that engages in the corresponding notch and is configured to cause the engagement element to be guided via the second notch end.

4. The housing module of claim 3, wherein each guide head includes a first inclined surface on the associated second notch end, which extends obliquely with respect to the cross-sectional plane of the partition wall,
 wherein the first inclined surface is configured to impart a component of movement in a direction of the main body upon movement of the engagement element to its target position.

5. The housing module of claim 2, wherein for each engagement element the holding device includes at least one second guide body, which protrudes from the main body, wherein each second guide body includes at least one second inclined surface, which second inclined surface extends obliquely with respect to the cross-sectional plane of the partition wall,
 wherein the second inclined surface is configured to impart to a component of movement parallel to a cross-sectional surface of the partition wall in a direction of the housing wall upon movement of the engagement element to its target position.

6. The housing module of claim 1, wherein the partition wall includes at least one first hole having with an internal thread for each engagement element,
  wherein each engagement element includes a through-hole, each through-hole being coaxial with the corresponding first hole when the engagement elements are in their respective target positions,
  wherein each engagement element is fixed in the target position by screws that each engage in the internal thread of the corresponding first hole.

7. The housing module of claim 6, wherein for each screw the holding device includes a receiving device configured to receive a screw head of the corresponding screw,
  wherein, when an engagement element is fixed in its target position by the corresponding screw, the screw head of the corresponding screw is countersunk in the receiving device.

8. The housing module of claim 2, wherein the holding device is made of a plastic material using injection molding.

9. The housing module of claim 1, wherein each engagement element is made of a metal or a metal alloy.

10. The housing module of claim 3, wherein the partition wall includes at least one recess adapted to at least partially receive the at least one first guide body.

11. The housing module of claim 1, wherein the partition wall has a feedthrough configured to enable an electrical connection between the measurement/control electronics and the interface electronics,
  wherein the feedthrough is disposed in a through-opening of the partition wall.

12. A field device of measurement and automation technology, the field device comprising:
  a housing module according to claim 1;
  a measuring transducer configured to detect at least one measured variable and generate a measurement signal representing the at least one measured variable,
  wherein the measurement/control electronics unit is configured to determine and generate measured values of the at least one measured variable based on the measurement signal.

* * * * *